United States Patent
Lee

(10) Patent No.: US 6,353,575 B2
(45) Date of Patent: Mar. 5, 2002

(54) ECHO CLOCK GENERATING CIRCUIT OF SEMICONDUCTOR MEMORY DEVICE AND METHOD THEREOF

(75) Inventor: Kwang-Jin Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/848,785

(22) Filed: May 3, 2001

(30) Foreign Application Priority Data

May 3, 2000 (KR) .......................................... 2000-23652

(51) Int. Cl.$^7$ ................................................. G11C 8/18
(52) U.S. Cl. ........................ 365/233; 365/228; 365/190; 365/189.05
(58) Field of Search ................................ 365/233, 190, 365/228, 226, 189.05

(56) References Cited

U.S. PATENT DOCUMENTS 5,646,571 A * 7/1997 Ohashi ........................ 327/390
5,875,134 A * 2/1999 Cloud .......................... 365/193
5,920,511 A * 7/1999 Lee et al. ............... 365/189.05
5,986,948 A * 11/1999 Cloud .......................... 365/193
6,134,180 A * 10/2000 Kim et al. ................... 365/233

* cited by examiner

*Primary Examiner*—Andrew Q. Tran
(74) *Attorney, Agent, or Firm*—Marger Johnson & McCollom, P.C.

(57) ABSTRACT

A semiconductor memory device for providing data together with an echo clock as an indicating signal representing a time for providing or presenting data in an electronic system is described. The device comprises an echo data latch circuit for generating a source signal of the echo clock in response to an output of a sense amplifier for sensing and amplifying the data of a memory cell during a read operation, and for producing the source signal of the echo clock in response to a predetermined level of power voltage during a write operation; and an output circuit, connected between the echo data latch circuit and an echo clock output terminal, for receiving the source signal of the echo clock and for outputting the echo clock to the output terminal in response to control data relating to an external clock, thereby minimizing or reducing clock skew and also preventing speed push.

14 Claims, 6 Drawing Sheets

ECHO CLOCK GENERATING CIRCUIT OF SEMICONDUCTOR MEMORY DEVICE AND METHOD THEREOF

BACKGROUND OF THE INVENTION

1. Field of the Invention

The present invention relates to a semiconductor memory device, and more particularly, to an echo clock generating circuit and manufacturing method therefor appropriate to a synchronous-type semiconductor memory device.

2. Discussion of Related Art

Computers pervade daily life and users demand increasingly higher speed operation as part of higher performance.

In most electronic systems such as a computer etc., a main memory and a cache memory are realized by using random access memory (RAM) chips as the semiconductor memory device, wherein the RAM may be divided into two mutually different categories, namely, a static RAM and a dynamic RAM. Such RAMs types have their own peculiar operational characteristics and applications within the electronic system. For example, static RAM is widely used as the cache memory and dynamic RAM is widely used as main memory.

A synchronous pipeline type semiconductor memory device architecture obtains higher speed operation thereof. In these semiconductor memory devices, devices are provided for transmitting output data, together with echo clocks as indicating signals, to provide data at high speed to a microprocessor or a central processing unit (CPU) etc. For example, the U.S. Pat. Nos. 5,986,948, 5,875,134 or 5,920,511 disclose a technique concerning use of an echo clock to sense a time at which data output by a memory device is valid and stable. The CPU within the electronic system fetches output data at a high speed without error despite an operating environment that may change according to power and temperature etc. It does so by monitoring the echo clock when fetching data output from a semiconductor memory device.

In a typical semiconductor memory device the echo clock is outputted only during a read operation, but in a device such as an SRAM providing double data rate (DDR) operation, the echo clock is outputted during all read and write operations. In such a device, the echo clock is generated by fixing a main data signal line, for use by the echo clock at power voltage or ground voltage, in contrast to sensing a potential level developed on a main data line connected to a sense amplifier and then producing the echo clock. A drawback is that the main data signal line is developed only during a read operation but is not developed during a write operation. So, this conventional method is useful only during a read operation.

Moreover, such a system has the shortcoming that a skew between output data and echo clock edge may become large at times during the operation of the semiconductor memory device.

FIG. 1 shows a circuit block diagram for echo clock generation in a conventional semiconductor memory device. Referring to FIG. 1, output data DQ provided through an output buffer 18 and an off-chip driver 20 are first sensed and amplified in a sense amplifier 14 and latched by a data latch 16 through a main data line and a complementary main data line. The data sensed and amplified by the sense amplifier 14 are the read data developed in a memory cell array 10 through a Y path array 12. When the output data DQ are output through this reading path, an off-chip driver 32 connected to the output of an echo output buffer 30 outputs an echo clock CQ.

As shown in FIG. 1, the main data line for an echo clock (an input line of an echo data latch 28) and the complementary main data line for the echo clock are fixed at a power voltage VDD and a ground voltage GND. During operation of such a system, the skew between the output data DQ and the echo clock CQ is represented as a time difference T shown in FIG. 2. Those of skill in the art will appreciate that large clock skew is a problem. FIG. 2 shows an operational timing diagram of clocks of FIG. 1 and related signals. FIG. 2 illustrates the case where the skew between the output data DQ and the echo clock CQ exceeds nanoseconds, even though the required data output timing is satisfied in accordance with this conventional technique.

Therefore, it is desirable to provide an improved method of minimizing clock skew to prevent a so called "speed push."

SUMMARY OF THE INVENTION

Accordingly, the present invention is directed to an echo clock generating circuit and manufacturing method therefor a semiconductor memory device that substantially obviate one or more of the limitations and disadvantages of the related art.

A primary object of the present invention is to provide a semiconductor integrated circuit device capable of substantially solving the above-mentioned problems.

Another object of the present invention is to provide an echo clock generating circuit and manufacturing method therefore appropriate to a synchronous pipeline-type semiconductor memory device architecture.

Yet another object of the invention is to provide an echo clock generating method and therefor circuit, which is capable of minimizing clock skew and preventing so-called 'speed push' during an operational cycle.

To achieve these and other advantages, a semiconductor memory device is provided for producing data together with an echo clock as an indicating signal representing the earliest possible time for presenting data in an electronic system. The semiconductor memory device comprises an echo data latch circuit for generating a source signal of the echo clock. It does so in response to an output of a sense amplifier for sensing and amplifying data of a memory cell during a read operation, and for producing the source signal of the echo clock in response to a predetermined level of power voltage during a write operation. The device further comprises an output circuit including an echo clock generating circuit connected between the echo data latch circuit and an echo clock output terminal for receiving the source signal of the echo clock and for outputting the echo clock to the output terminal in response to control data relative to an external clock.

In an another inventive aspect, a method is provided for generating an echo clock in a semiconductor memory device by providing data together with an echo clock as an indicating signal representing the earliest possible time for presenting the data in an electronic system. The method comprises generating an echo clock in response to an output of a sense amplifier for sensing and amplifying the data of a memory cell during a read operation and for producing the echo clock in response to a predetermined level of power voltage during a write operation.

Accordingly, clock skew is minimized or at least greatly reduced yet without a large increase in chip area.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

Figure 3:
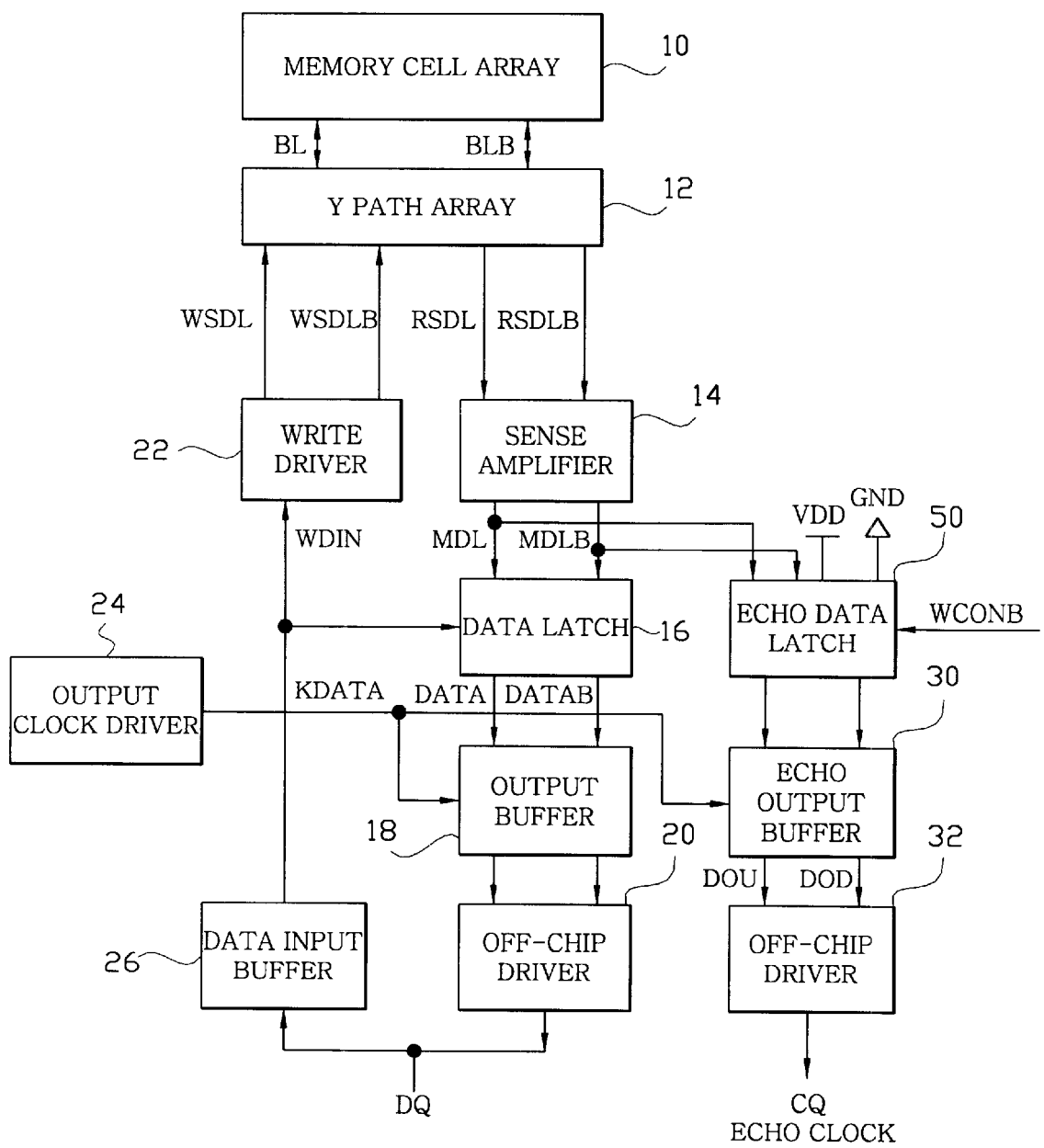
FIG. 3 depicts a circuit block diagram for an echo clock generation in a semiconductor memory device in accordance with the preferred embodiment of the present invention.
Figure 4:
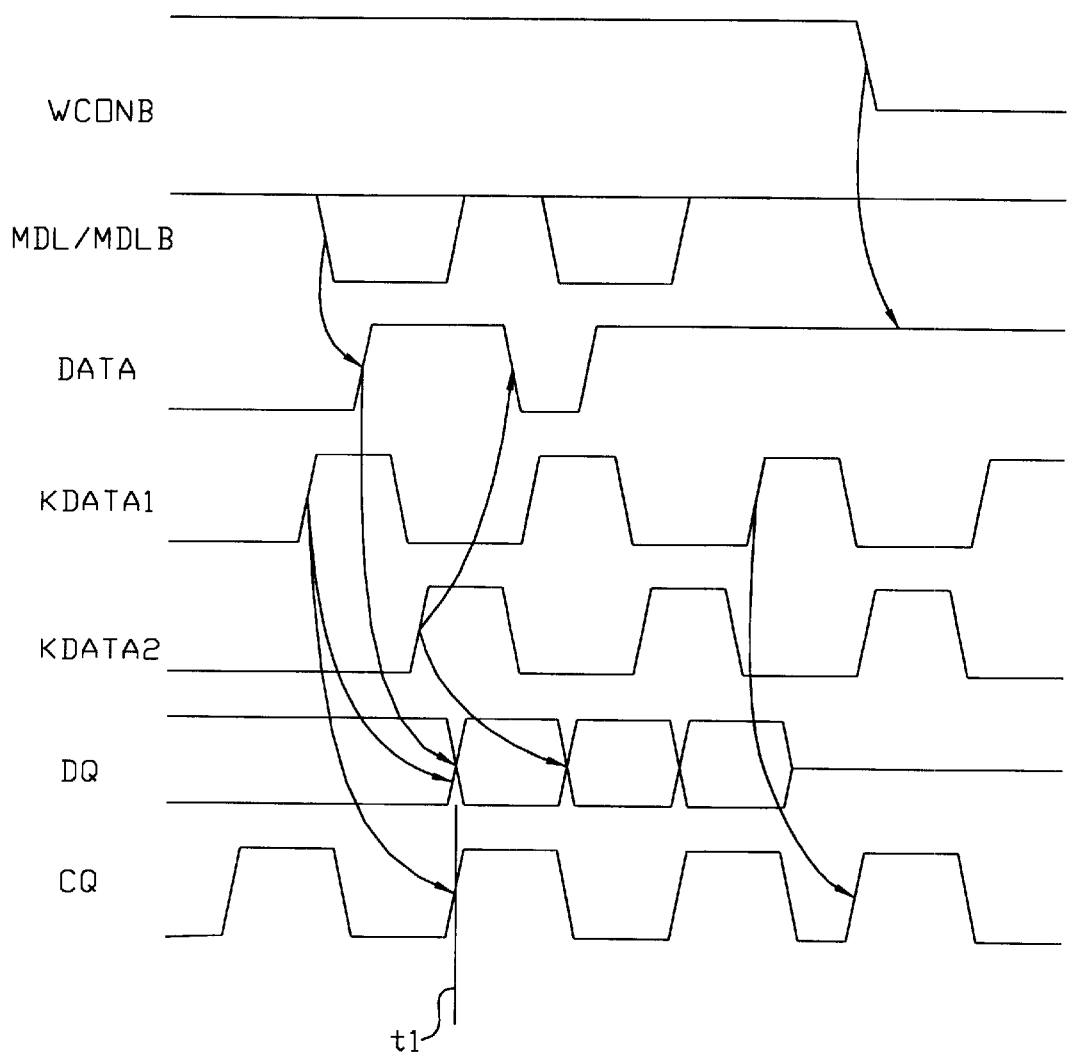
Figure 5:
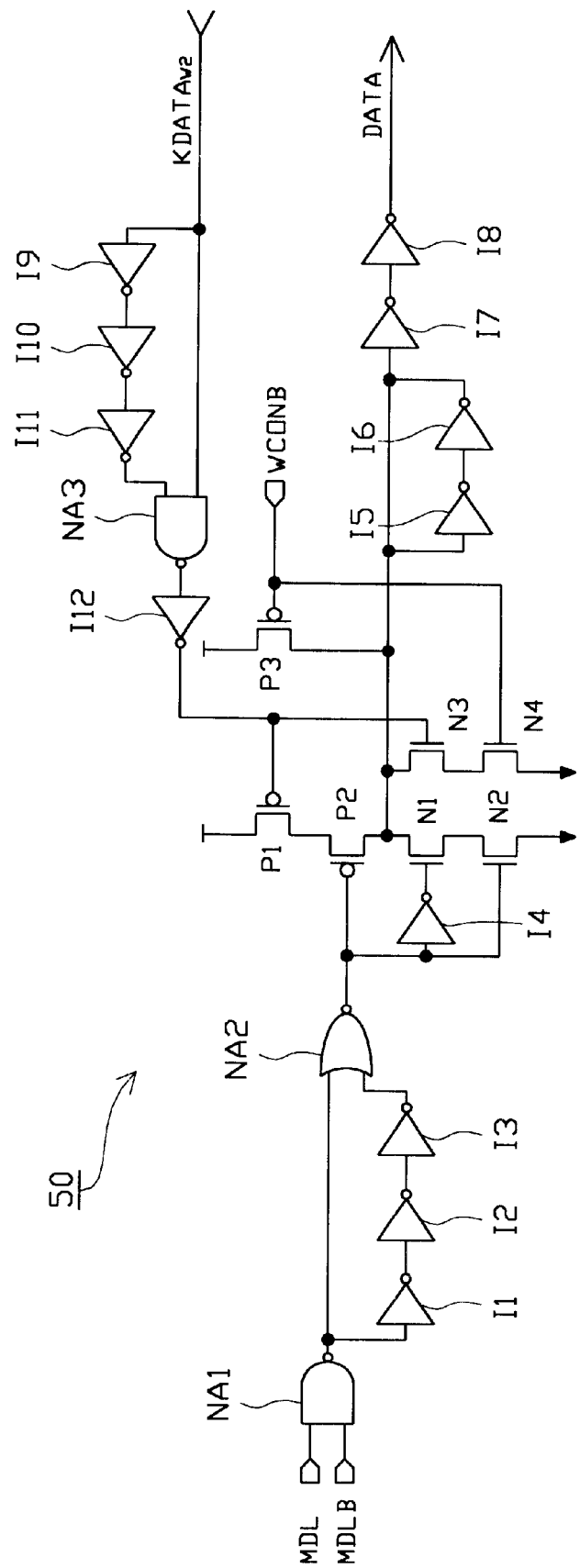
Figure 6:
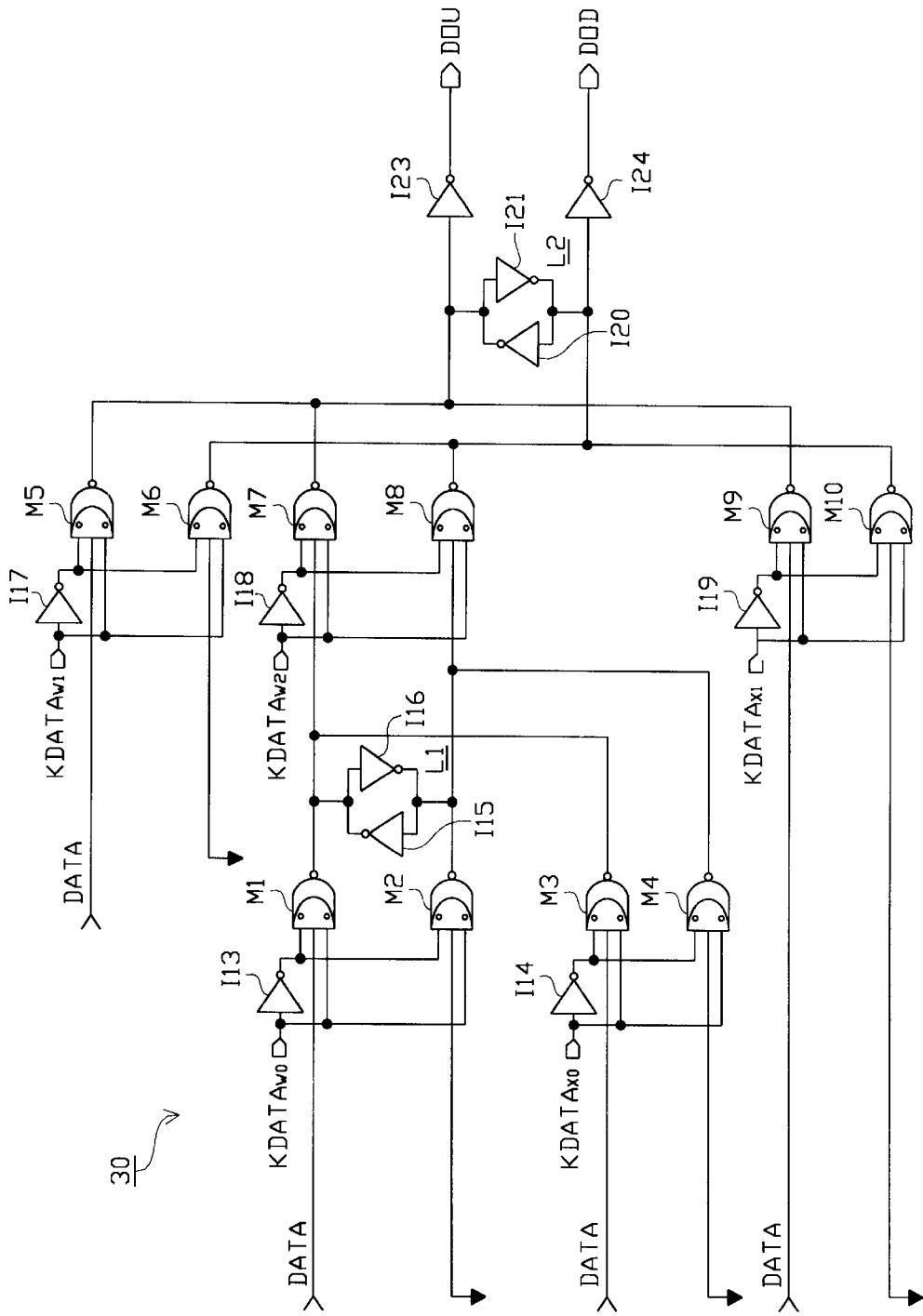

FIG. 4 sets forth an operational timing diagram for the clocks shown in FIG. 3;

FIG. 5 represents a detailed circuit diagram showing a preferred embodiment of an echo data latch shown in FIG. 3; and FIG. 6 offers a detailed circuit diagram illustrating a preferred embodiment of an echo output buffer shown in FIG. 3.

DETAILED DESCRIPTION OF PREFERRED EMBODIMENT

Reference will now be made in detail to the preferred embodiments of the present invention, examples of which are illustrated in the accompanying drawings. In the following description to attain the inventive objects, advantages and characteristics, the same or similar parts have the same or similar reference numbers and characters for the sake of explanatory and understanding convenience.

FIG. 3 depicts a circuit block diagram for echo clock generation in a semiconductor memory device in accordance with the preferred embodiment of the present invention. An echo data latch 50 receives an input through two paths, and a writing control signal WCONB is applied to the echo data latch 50. Thus, when the semiconductor memory device performs a read operation, a source signal of the echo clock CQ outputted through the off-chip driver 32 becomes the logic level corresponding to the cell data. The cell data is represented by a main data line MDL and a complementary main data line MDLB connected to complementary output terminals of the sense amplifier 14. In other words, the cell data stored in a memory cell selected within the memory cell array 10 is output through the sense amplifier 14 during the read operation is developed on a complementary main data line pair used to source the echo clock CQ.

During a write operation a voltage level is established as the source signal of the echo clock CQ. Specifically, the main and complementary data lines for the echo clock which are input to the echo data latch 50, are fixed respectively at a first voltage level VDD and a second voltage level GND, as shown in FIG. 3.

To perform an echo data latch operation differently according to the read and write operations in the echo data latch 50, the write control signal WCONB is used to distinguish between the two operations. (The write control signal WCONB is the static signal enabled to a "low" logic level only during the writing operation. It is not necessary to consider a skew between a data clock and an echo clock during a write operation. This is because, during a write operation only the echo clock is transmitted. During a read operation, in accordance with the preferred embodiment of the present invention, any skew between the output data early DQ and the echo clock CQ is minimized by generating the echo clock early according to the development of the main data line pair.

Thus, the conventional skew problem between Data DQ and echo clock CQ is minimized by producing the echo clock in a different manner from that conventionally used. Such skew reduction will be better understood from an operational timing diagram shown in FIG. 4.

FIG. 4 sets forth the operational timing diagram for clocks and other signals shown in FIG. 3. During a high level of the writing control signal WCONB, the MDL/MDLB signals are developed on the main data line pair as the output of the sense amplifier 14 during the read operation. The echo data latch 50 outputs DATA for the echo clock as a logic high state through its output terminal and also outputs complementary data DATAB for the echo clock as a logic low state through its complementary output terminal, in response to the MDL/MDLB signals.

Figure 2:
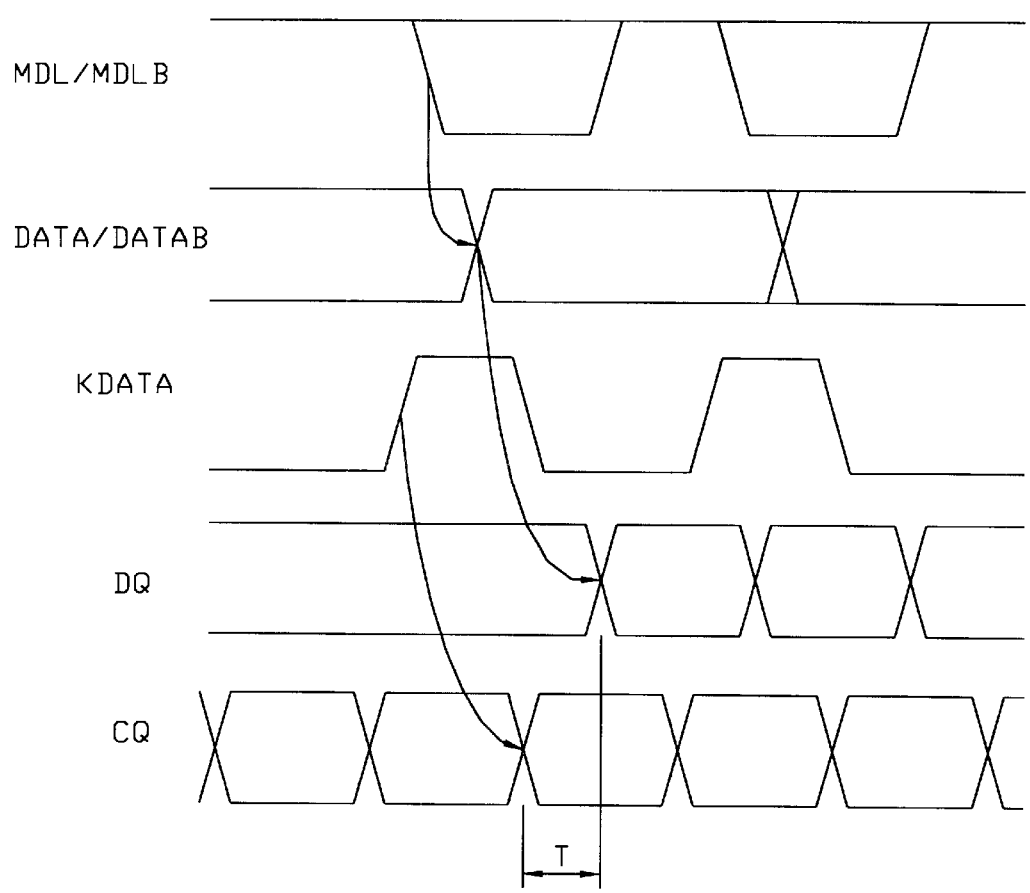
FIG. 2 illustrates an operational timing diagram of the clocks shown in FIG. 1.

Next, the echo data latch 50 is disabled in response to a rising edge of control data KDATA2 generated on the basis of a polling edge of an outer clock. The output terminal again goes to a low level. Then, in the next operational cycle, the echo data latch 50 waits for development of the MDL/MDLB signals. As shown in the drawing, the echo clock CQ is transited to a high state in response to a rising edge of control data KDATA1. As a result, there is almost no skew at all between output data DQ and echo clock CQ. This is because CQ is gated based not on KDATA timing as in conventional techniques (see FIG. 2), but instead on the earlier KDATA timing, the same timing that generates output data DQ. This nearly zero skew between output data DQ and the echo clock CQ in accordance with the invention is indicated as narrow (effectively non-existent) time delay t1 shown in FIG. 4.

The writing control signal WCONB transits to a low state during the write operation. Accordingly, the data DATA for the echo clock is fixed as a logic high state and then is output from the echo data latch 50. Thus, the data DATA for the echo clock is maintained at the first power voltage VDD when the echo data latch 50 receives the write control signal WCONB at a low state. Those of skill in the art will appreciate that the echo clock CQ is enabled to a high level in response to the control data KDATA1 as by the conventional technique.

It may be seen from FIG. 4 that skew between the output data DQ and the echo clock CQ scarcely occurs in the operational cycle limit area. In other words, there is virtually zero clock skew between the output data DQ and the echo clock CQ during an operational and output data cycle by use of the present invention. Thus, the skew between the output data and the echo clock can be sharply reduced by employing the invented echo clock generating system in the semiconductor memory device.

Referring to FIGS. 5 and 6, an exemplary construction and its operation for an echo output buffer 30 and the echo data latch 50 of FIG. 3 are described as follows.

FIG. 5 presents one preferred embodiment for the echo data latch 50. With reference to the drawing, in the reading operation mode, the writing control signal WCONB becomes a high level and is applied to gates of a PMOS transistor P3 and an NMOS transistor N4. The PMOS transistor P3 achieves an off state, and a NAND gate NA1 outputs a high level in conformity with development of the MDL/MDLB signals. A NOR gate NA2 performs a NOR gating for the high output of the NAND gate NA1 and a low output of an inverter 13 and produces a logic low level as its output. Therefore, when a PMOS transistor P1 achieves a turn-on state, a PMOS transistor P2 also achieves the turn-on state. This produced high level is output as the data DATA for the echo clock, from an inverter 18 through an inverter 17. Then, an output of a NAND gate NA3 becomes a low state in response to a rising edge of the control data KDATA2 generated on the basis of a polling edge of an outer clock, and the PMOS transistor P1 is turned off by an output of an inverter 112. The NMOS transistor N3 is turned on and its output terminal goes to a low level. In the next operational cycle, the echo data latch 50 awaits development of the MDL/MDLB signals, i.e. it awaits a time when they approach voltage levels accurately and stably representing the data cell content. During the write operation, the write control signal WCONB is applied at a low level. Thus, the PMOS transistor P3 is turned on and the data signal is maintained at the level of the first power voltage VDD.

During read operation, the circuit of FIG. 5 described above senses development of the MDL/MDLB signals, generates the data DATA for the echo clock, is disabled to a low state in response to the control data KDATA2, and then again senses a development of the MDL/MDLB signals in the next operational cycle. During the write operation, the circuit fixes the data DATA for the echo clock at a predetermined level of the first power voltage in response to the logic level of the write control signal WCONB and then generates the echo clock signal.

FIG. 6 represents one preferred embodiment of the echo output buffer 30. During the read operation, the data DATA for the echo clock outputted from the echo data latch 50 is applied to input terminals of the transmission gates M1, M3, M9, M5 within the circuit. Input terminals of transmission gates M2, M4, M10, M6 are connected with the second power voltage, e.g. an earth ground. Transmission gates M1, M2 receive a logic level of a control signal KDATAw0 through its respective clock terminals and are enabled selectively. The enabled transmission gate among the transmission gates M1, M2 transfers the signal applied to its input terminal to an output terminal. The transmission gates M3, M4 are selectively enabled in response to the logic level of a control signal KDATAx0, and the transmission gates M9, M10 are selectively enabled in response to the logic level of a control signal KDATAx1. The transmission gates M5, M6 are selectively enabled in response to the logic level of a control signal KDATAw1. The transmission gates M7, M8 are selectively enabled in response to the logic level of a control signal KDATAw2. A first latch L1 is connected between the output terminals of the transmission gate M1 and the transmission gate M2, and performs an inverter latching function. A second latch L2 is connected between an input terminal of an inverter I23 for a pull-up output and an input terminal of an inverter I24 for a pull-down output, and executes an inverter latching function. In the drawings, the transmission gates are embodied by clocked CMOS inverter circuits, but in other embodiments gates within the spirit and scope of the invention, they may be replaced by another transmission.

Figure 1:
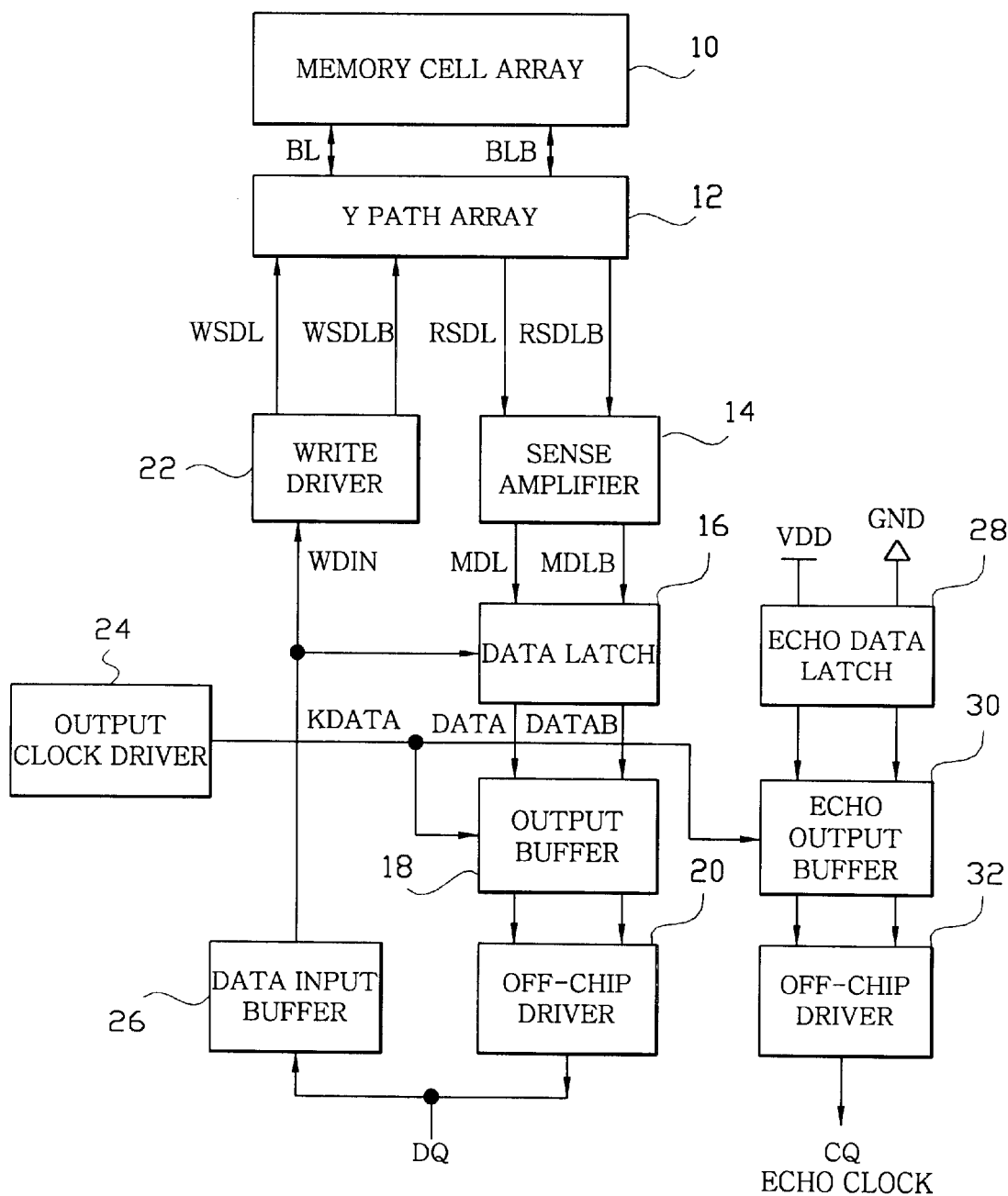
FIG. 1 shows a circuit block diagram for an echo clock generation in a conventional semiconductor memory device.

The circuit shown in FIG. 6 is substantially the same as a conventional data output buffer, and provides the off-chip driver 32 with an output of the echo data latch 28 in response to the control signals. The off-chip driver 32 preferably includes pull-up and pull-down transistors connected in series with each other between the power voltage and the ground voltage, as is disclosed in U.S. Pat. No. 5,646,571 (in which elements for driving an output terminal 414 of FIG. 1 may correspond to the invented off-chip driver). The cited patent disclosure is incorporated herein by this reference.

When the semiconductor memory device is in the read operation mode, the off-chip driver 32 outputs the echo clock CQ. In this case, the source signal of the echo clock is a logic level of cell data developed on the main data line MDL and the complementary main data line MDLB connected to the output terminal of the sense amplifier 14. In the write operation mode, the off-chip driver 32 also outputs the echo clock CQ. In this case, the source signal of the echo clock is a logic level fixed at a predetermined voltage level.

Accordingly, skew between the data clock and the echo clock during a write operation need not be considered since it requires a transmission for only the echo clock therein. In the read operation mode, any skew between the output data DQ and the echo clock CQ is minimized, since the echo clock is generated according to an early development of data on the main data line pair.

In the preferred embodiment of the invention, clock skew is minimized without a large increase in chip size. This is made possible by using a system for sensing a development of the MDL/MDLB signals instead of using a dummy sense amplifier or a dummy data latch.

As aforementioned, in accordance with the present invention, clock skew is minimized or sharply reduced yet without greatly increasing an occupation area of a chip.

Accordingly, in applying the invention to the semiconductor memory device, high speed and accurate memory operation ensured, and thus memory performance is greatly improved.

It will be apparent to those skilled in the art that various modifications and variations can be made in the present invention without deviating from the spirit or scope of the invention. Thus, it is intended that the present invention cover the modifications and variations of this invention provided they come within the scope of the appended claims and their equivalents. For example, the detailed construction of an echo data latch and an echo output buffer to another may be changed including similar elements or MDL/MDLB signals may be sensed using a constant time delay. Such alternative embodiments are within the spirit and scope of the prevent invention.

What is claimed is:

1. A method for generating an echo clock in a semiconductor memory device and for providing data together with the echo clock as an indicating signal representing a time for presenting data in an electronic system, said method comprising the steps of:

generating the echo clock in response to an output of a sense amplifier for sensing and amplifying the data of a memory cell during a read operation; and producing the echo clock in response to a predetermined level of power voltage during a write operation.

2. The method of claim 1, wherein the electronic system is a microprocessor.

3. The method of claim 1, wherein said echo clock transits from a high level to a low level in response to a rising edge of control data generated on the basis of a polling edge of an external clock.

4. The method of claim 1, wherein said read and write operations are distinguished by the presence or absence of a write control signal.

5. The method of claim 1, wherein said predetermined level of power voltage is an operating power voltage.

6. The method of claim 1, wherein said predetermined level of power voltage is a ground power voltage.

7. A device in a semiconductor memory subsystem of an electronic system for providing data together with an echo clock as an indicating signal representing a time for providing the data, said device comprising:

an echo data latch circuit for generating a source signal of the echo clock in response to an output of a sense amplifier for sensing and amplifying the data of a memory cell during a read operation and for producing the source signal of the echo clock in response to a predetermined level of power voltage during a write operation; and an output circuit, connected between the echo data latch circuit and an echo clock output terminal, for receiving the source signal of the echo clock and for outputting the echo clock to the output terminal in response to control data relative to an external clock.

8. The device of claim 7, wherein the electronic system is a microprocessor or a computer containing the microprocessor.

9. The device of claim 7, wherein said echo clock transits from a high level to a low level in response to a rising edge of the control data generated on the basis of a polling edge of the external clock.

10. The device of claim 7, wherein said echo data latch circuit performs an operation on the basis of a logic level of a write control signal dependent upon a mode control signal signifying one of the read operation and the write operation.

11. The device of claim 7, wherein said predetermined level of power voltage is an operating power voltage.

12. The device of claim 7, wherein said predetermined level of power voltage is a ground power voltage.

13. A synchronous semiconductor memory device in an electronic system for providing data together with an echo clock as an indicating signal representing a time for providing the data, said device comprising:

an echo data latch circuit for generating a source signal of the echo clock in response to a level of a data signal furnished onto a main data line connected to an output of a sense amplifier which senses and amplifies the data of a memory cell during a read operation, and for producing the source signal of the echo clock in response to a determined level of power voltage on an echo main data line during a write operation; and an output circuit, connected between the echo data latch circuit and an echo clock output terminal, for receiving the source signal of the echo clock and for outputting the echo clock to the output terminal in response to control data relative to an external clock.

14. The device of claim 13, wherein said echo data latch circuit senses development of a signal appearing on a main data line pair provided as the output of the sense amplifier in response to a first logic level of a write control signal and generates source data for use by the echo clock during the read operation, the latch circuit being disabled to a low state in response to the control data, the latch circuit again sensing the development of the signal on the main data line pair in a next operation cycle; the latch circuit fixing the source data for use by the echo clock at the level of the power voltage in response to a second logic level of the write control signal during the write operation, thereby to produce synchronized source data and echo clock signals in the electronic system.

* * * * *

UNITED STATES PATENT AND TRADEMARK OFFICE
CERTIFICATE OF CORRECTION

PATENT NO.    : 6,353,575 B2
DATED         : March 5, 2002
INVENTOR(S)   : Lee

It is certified that error appears in the above-identified patent and that said Letters Patent is hereby corrected as shown below:

Column 4,
Line 64, "inverter 13" should read -- inverter I3 --.

Column 5,
Line 1, "inverter 18" should read -- inverter I8 --.
Line 2, "17." should read -- I7 --.
Line 6, "112." should read -- I12. --.

Column 8,
Line 19, "during the" should read -- during a --.
Line 26, "during the write" should read -- during the write --.

Signed and Sealed this

Twenty-sixth Day of November, 2002

Attest:

JAMES E. ROGAN
Attesting Officer    Director of the United States Patent and Trademark Office